United States Patent
Hayashi et al.

(10) Patent No.: US 8,426,243 B2
(45) Date of Patent: Apr. 23, 2013

(54) AMORPHOUS OXIDE SEMICONDUCTOR AND THIN FILM TRANSISTOR USING THE SAME

(75) Inventors: Ryo Hayashi, Yokohama (JP); Hideyuki Omura, Tokyo (JP); Hideya Kumomi, Tokyo (JP); Yuzo Shigesato, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/353,077

(22) Filed: Jan. 18, 2012

(65) Prior Publication Data

US 2012/0115276 A1    May 10, 2012

Related U.S. Application Data

(62) Division of application No. 12/534,436, filed on Aug. 3, 2009, now Pat. No. 8,129,718.

(30) Foreign Application Priority Data

Aug. 28, 2008  (JP) ................... 2008-219888

(51) Int. Cl.
*H01J 21/00* (2006.01)
*H01L 21/16* (2006.01)

(52) U.S. Cl.
USPC .............. 438/104; 257/104; 257/E21.462; 257/E21.324; 257/E29.297

(58) Field of Classification Search .......... 438/104; 257/43, E29.297, E21.462, E21.324
See application file for complete search history.

(56) References Cited

U.S. PATENT DOCUMENTS

| | | | |
|---|---|---|---|
| 5,970,361 | A | 10/1999 | Kumomi |
| 6,058,945 | A | 5/2000 | Fujiyama |
| 6,331,474 | B1 | 12/2001 | Hayashi |
| 6,727,522 | B1 | 4/2004 | Kawasaki |
| 6,794,275 | B2 | 9/2004 | Kondo |
| 6,855,621 | B2 | 2/2005 | Kondo |
| 6,858,308 | B2 | 2/2005 | Kondo |
| 7,064,346 | B2 | 6/2006 | Kawasaki |
| 7,282,132 | B2 | 10/2007 | Iwata |
| 7,411,209 | B2 | 8/2008 | Endo |

(Continued)

FOREIGN PATENT DOCUMENTS

| | | |
|---|---|---|
| JP | 2007-73697 | 3/2007 |
| JP | 2007-194594 | 8/2007 |
| WO | 2007/029844 | 3/2007 |
| WO | 2008/069286 | 6/2008 |

OTHER PUBLICATIONS

Korean Office Action dated Dec. 1, 2011 issued during prosecution of related Korean application No. 10-2009-0076009 (includes whole English-language translation).

Search Report dated Feb. 17, 2010 in European Application No. 09010057.9.

(Continued)

*Primary Examiner* — Jarrett Stark (74) *Attorney, Agent, or Firm* — Fitzpatrick, Cella, Harper & Scinto (57) ABSTRACT

There is provided an amorphous oxide semiconductor including hydrogen and at least one element of indium (In) and zinc (Zn), the amorphous oxide semiconductor containing one of hydrogen atoms and deuterium atoms of $1 \times 10^{20}$ cm$^{-3}$ or more to $1 \times 10^{22}$ cm$^{-3}$ or less, and a density of bonds between oxygen and hydrogen except bonds between excess oxygen ($O_{EX}$) and hydrogen in the amorphous oxide semiconductor being $1 \times 10^{18}$ cm$^{-3}$ or less.

4 Claims, 7 Drawing Sheets

U.S. PATENT DOCUMENTS

| | | | |
|---|---|---|---|
| 7,791,074 B2* | 9/2010 | Iwasaki | 257/59 |
| 8,044,402 B2 | 10/2011 | Yabuta | |
| 2006/0110867 A1 | 5/2006 | Yabuta | |
| 2007/0090365 A1 | 4/2007 | Hayashi | |
| 2007/0194379 A1 | 8/2007 | Hosono | |
| 2007/0215945 A1 | 9/2007 | Tokunaga | |
| 2008/0023703 A1 | 1/2008 | Hoffman | |
| 2008/0272370 A1* | 11/2008 | Endo et al. | 257/43 |
| 2009/0045397 A1 | 2/2009 | Iwasaki | |
| 2009/0065771 A1* | 3/2009 | Iwasaki et al. | 257/43 |
| 2009/0325341 A1 | 12/2009 | Itagaki | |
| 2010/0051936 A1 | 3/2010 | Hayashi | |
| 2010/0051938 A1* | 3/2010 | Hayashi et al. | 257/43 |
| 2010/0051947 A1 | 3/2010 | Yabuta | |
| 2010/0051949 A1* | 3/2010 | Yamazaki et al. | 257/57 |
| 2010/0065837 A1 | 3/2010 | Omura | |
| 2010/0159639 A1* | 6/2010 | Sakata | 438/104 |

OTHER PUBLICATIONS

Search Report dated Apr. 21, 2010 in European Application No. 09010057.9.

* cited by examiner

FIG. 1A
a-IGZO+H

FIG. 1B
a-IGZO+O

FIG. 1C
a-IGZO+OH

FIG. 1D
a-IGZO+OH$_2$

FIG. 1E
a-IGZO+O$_{EX}$H

FIG. 1F
a-IGZO+O$_{EX}$H$_2$

FIG. 2A a-IGZO

FIG. 2B a-IGZO+H

FIG. 2C a-IGZO+O

FIG. 2D a-IGZO+OH

FIG. 2E a-IGZO+OH$_2$

FIG. 2F a-IGZO+O$_{EX}$H

FIG. 2G a-IGZO+O$_{EX}$H$_2$

AMORPHOUS OXIDE SEMICONDUCTOR AND THIN FILM TRANSISTOR USING THE SAME

This application is a division of Application Ser. No. 12/534,436, filed Aug. 3, 2009, allowed.

BACKGROUND OF THE INVENTION

1. Field of the Invention

The present invention relates to an amorphous oxide semiconductor, a thin film transistor using the amorphous oxide semiconductor film, and a method of manufacturing the thin film transistor.

2. Description of the Related Art

Recently, semiconductor devices using metal oxide semiconductor thin films have attracted attention. The thin films are characterized by being able to be formed at low temperatures, and having a large optical band gap so as to be transparent to visible light. Thus, a flexible and transparent thin film transistor (TFT) or the like may be formed on plastic substrates, film substrates, and the like (U.S. Pat. No. 6,727,522).

Conventionally, an oxide semiconductor film used as a TFT active layer is, in order to control the electrical characteristics of the film, generally formed in an atmosphere with oxygen gas introduced thereinto. For example, U.S. Patent Application Publication No. 2007/0194379 discloses a method of forming a thin film transistor (TFT) in which an n-type oxide semiconductor containing indium gallium zinc oxide (In—Ga—Zn—O) is used as a channel layer and indium tin oxide (ITO) is used as source and drain electrodes. In the film forming method described in U.S. Patent Application Publication No. 2007/0194379, by controlling the partial pressure of oxygen in an atmosphere in which the In—Ga—Zn—O film is formed, carrier density is controlled, thereby obtaining a high carrier mobility.

Further, Japanese Patent Application Laid-Open No. 2007-073697 discloses a technology of including water vapor in an atmosphere gas in sputtering as a method of manufacturing a high performance thin film transistor in which the above-mentioned oxide semiconductor film is used as a channel layer. Further, U.S. Patent Application Publication No. 2009/0045397 and Japanese Patent Application Laid-Open No. 2007-194594 disclose technologies of controlling the carrier density by introducing hydrogen into an oxide semiconductor used as a channel layer of a thin film transistor.

However, in a conventional oxide semiconductor film, even when the carrier density is controlled by introducing hydrogen as disclosed in U.S. Patent Application Publication No. 2009/0045397 and Japanese Patent Application Laid-Open No. 2007-194594, the amount of hydrogen in the oxide semiconductor is orders of magnitude greater than the carrier density. In other words, there is a problem that it is impossible to control the carrier density only by the amount of hydrogen in the film. Further, the inventors of the present invention have studied formation of amorphous oxide semiconductors including an amorphous In—Ga—Zn—O-based semiconductor by sputtering to find that the amorphous oxide semiconductors are very prone to take in hydrogen. For example, it has been found that, even when the back pressure of an oxide semiconductor sputtering apparatus is set to $2 \times 10^{-4}$ Pa or lower, there is a case in which hydrogen of $1 \times 10^{20}$ cm$^{-3}$ or more is contained. These studies have revealed that it is difficult to form an amorphous oxide semiconductor containing hydrogen of $1 \times 10^{20}$ cm$^{-3}$ or more at room temperature at low cost without pretreatment such as thermal treatment and to make the resistivity thereof appropriate for an amorphous oxide thin film transistor.

SUMMARY OF THE INVENTION

The present invention has been made in view of the above-mentioned problem, and an object of the present invention is to provide an amorphous oxide thin film transistor having excellent transistor characteristics.

According to the present invention, there is provided an amorphous oxide semiconductor containing hydrogen and at least one element of indium (In) and zinc (Zn), in which: the amorphous oxide semiconductor contains one of hydrogen atoms and deuterium atoms of $1 \times 10^{20}$ cm$^{-3}$ or more to $1 \times 10^{22}$ cm$^{-3}$ or less; and a density of bonds between oxygen and hydrogen except bonds ($O_{EX}$—H bond and H—$O_{EX}$—H bond) between excess oxygen ($O_{EX}$) (here, the excess oxygen means oxygen in excess in a micro region when a size of several atoms constituting a part of the amorphous oxide semiconductor) and hydrogen in the amorphous oxide semiconductor is $1 \times 10^{18}$ cm$^{-3}$ or less.

According to the present invention, there is also provided a display apparatus including a display device and a thin film transistor, the display device including an electrode connected to one of a source electrode and a drain electrode of the thin film transistor on a substrate, in which the thin film transistor is the thin film transistor described above.

According to the present invention, there is also provided a method of manufacturing a thin film transistor including at least a substrate, a channel layer, a gate insulating layer, a source electrode, a drain electrode, and a gate electrode, the channel layer including an amorphous oxide semiconductor containing hydrogen and at least one element of indium (In) and zinc (Zn), the method including: forming the channel layer by sputtering using a film forming gas containing water vapor; and carrying out thermal treatment at 150° C. or higher to 500° C. or lower after the channel layer is formed.

According to the present invention, there is also provided a method of manufacturing a thin film transistor including at least a substrate, a channel layer, a gate insulating layer, a source electrode, a drain electrode, and a gate electrode, the channel layer including an amorphous oxide semiconductor containing hydrogen and at least one element of indium (In) and zinc (Zn), the method including: forming the channel layer by applying a solution; and carrying out thermal treatment at 500° C. or lower after the channel layer is formed.

According to the present invention, there is also provided a method of manufacturing a thin film transistor including at least a substrate, a channel layer, a gate insulating layer, a source electrode, a drain electrode, and a gate electrode, the channel layer including an amorphous oxide semiconductor containing hydrogen and at least one element of indium (In) and zinc (Zn), the method including: forming the channel layer by electrodeposition; and carrying out thermal treatment at 500° C. or lower after the channel layer is formed.

The present invention is able to provide at low cost a TFT device in which an amorphous oxide semiconductor is used as a channel layer thereof and which may precisely control the carrier density and has satisfactory transistor characteristics.

Further features of the present invention become apparent from the following description of exemplary embodiments with reference to the attached drawings.

DESCRIPTION OF THE EMBODIMENTS

Embodiments of the present invention are described below with reference to the attached drawings.

First, a relationship between hydrogen and carrier density with regard to amorphous In—Ga—Zn—O on which the inventors of the present invention energetically conducted research and development is described.

Now it is known that, by injecting hydrogen ions into an amorphous In—Ga—Zn—O thin film used in an amorphous oxide semiconductor TFT, the electrical conductivity of the thin film is enhanced and hydrogen behaves as a donor in the film (see U.S. Patent Application Publication No. 2009/0045397). On the other hand, in an amorphous In—Ga—Zn—O thin film formed by sputtering or the like, even when ion implantation or the like is not carried out, hydrogen atoms of up to about $1 \times 10^{20}$ cm$^{-3}$ are contained. This comes from residual gas of molecular species containing hydrogen such as $H_2$ and $H_2O$ which exist in a chamber in which the film is formed. The amorphous In—Ga—Zn—O thin film formed in this way has a carrier electron density of about $1 \times 10^{18}$ cm$^{-3}$ or less depending on the film forming conditions. The difference between the concentration of hydrogen atoms and the carrier electron density in the film is about $1 \times 10^{2}$ cm$^{-3}$ or more, and thus, it is thought that most of the hydrogen atoms existing in the film do not function as a donor.

Reviews by the inventors of the present invention by calculating the electronic structure revealed that, depending on the bonding state between oxygen and hydrogen existing in the film, hydrogen which did not function as a donor existed, which is described in detail below. It is to be noted that, in the present invention, not only hydrogen atoms but also deuterium atoms are regarded as hydrogen involved in the carrier density.

(Calculation Model)

An amorphous InGaZnO$_4$ (a-IGZO) structural model was obtained as in the following. A crystalline InGaZnO$_4$ cell model containing 2,016 atoms was melted by classical molecular dynamics (MD) for 20 psec. at 8,000 K with a time step of 2 fsec. After rapid cooling from 8,000 K to 12 K at a rate of 125 K/psec., a classical MD simulation was performed for 100 psec. at 1 K. In this way, a stable structure of amorphous a-IGZO in the classical MD simulation was obtained. A cell containing 84 atoms which could be performed by first principles calculation was cut out from this model and was once again melted and rapidly cooled by the classical MD simulation under the above-mentioned conditions to obtain an 84-atom a-IGZO model. Buckingham potential was used in these classical MD simulations. Parameters of the potential were determined such that experimental values of the first nearest neighbor distances and mass densities of a-IGZO films were reproduced with errors of 2% or less and 10% or less, respectively.

Structural relaxation was calculated using first principles band calculation based on a plane-wave basis set and a projected argument wave method with the obtained 84-atom a-IGZO model as a unit cell to obtain a stable structure of an a-IGZO model with no impurity contained therein (hereinafter referred to as "pure a-IGZO"). The structural relaxation calculated using first principles band calculation which is described below used a plane-wave basis set with a cut-off energy of 400 eV, and a 4×4×1 Monkhost-Pack special k-point mesh under conditions such that the charge in the unit cell was neutral.

Figure 1A:
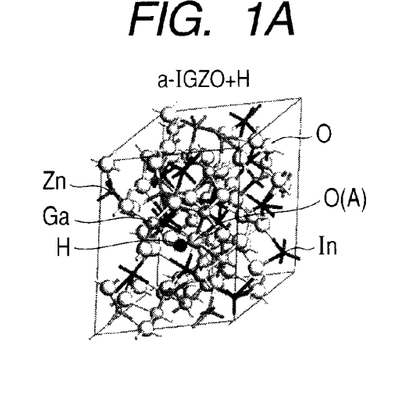
FIGS. 1A, 1B, 1C, 1D, 1E, and 1F illustrate atomic configurations obtained by calculating structural relaxation of an amorphous InGaZnO$_4$ (a-IGZO) structural model according to the present invention.
Figure 1B:
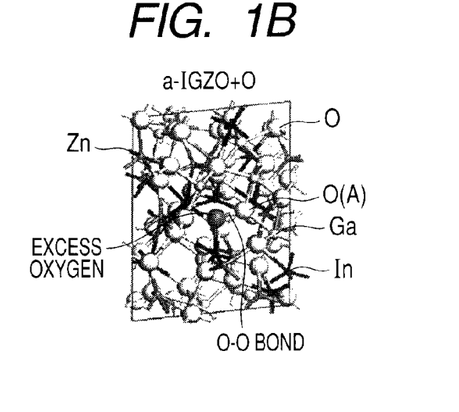
Figure 1C:
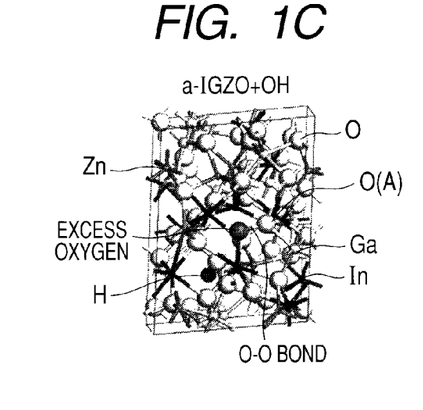
Figure 1D:
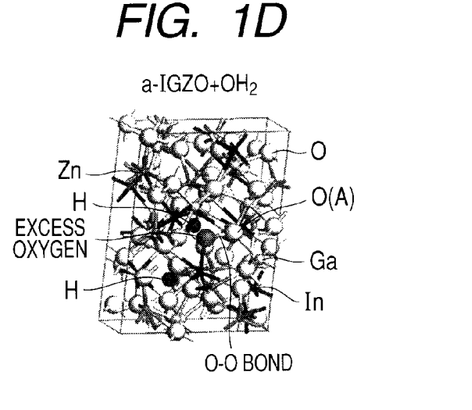
Figure 1E:
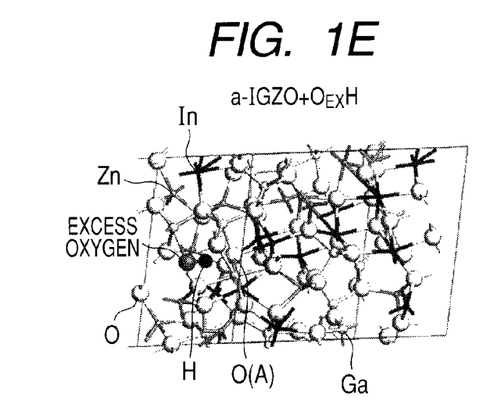

Structural relaxation was calculated with regard to a-IGZO having a hydrogen atom added thereto (hereinafter referred to as "a-IGZO+H") and a-IGZO having an oxygen atom $O_{EX}$ as excess oxygen added thereto (hereinafter referred to as "a-IGZO+O") as a-IGZO structural models containing an impurity. These atoms were located at a location which is about 0.15 nm from oxygen O(A) illustrated in the structural models of a-IGZO+H and a-IGZO+O of FIGS. 1A and 1B, respectively.

Then, structural relaxation was calculated with regard to the a-IGZO+O model after the structural relaxation, which has a hydrogen atom or two hydrogen atoms further added thereto at a location far from the added oxygen atom $O_{EX}$ (a-IGZO+OH or a-IGZO+OH$_2$). Further, structural relaxation was calculated with regard to the a-IGZO+O model after the structural relaxation, which has a hydrogen atom or two hydrogen atoms further added thereto at a location near the added oxygen atom $O_{EX}$ (a-IGZO+$O_{EX}$H or a-IGZO+$O_{EX}$H$_2$).

With regard to the structural models obtained by calculating the above-mentioned structural relaxation, density of states (DOS) was calculated. The structural models mean a-IGZO, a-IGZO+H, a-IGZO+O, a-IGZO+OH, a-IGZO+OH$_2$, a-IGZO+$O_{EX}$H, and a-IGZO+$O_{EX}$H$_2$. It is to be noted that, in calculating the density of states (DOS), cut-off energy of 400 eV and a 4×5×6 Monkhost-Pack special k-point mesh were used.

(Results of Calculation)

Figure 1F:
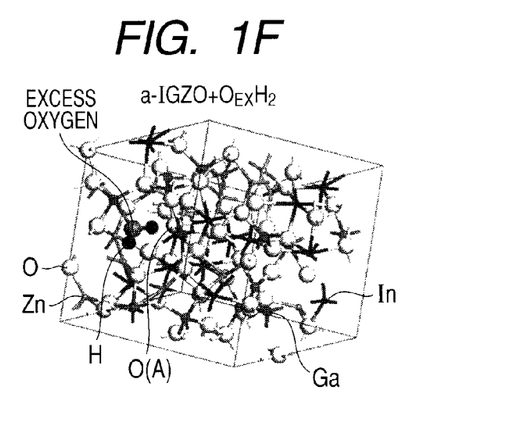

FIGS. 1A to 1F illustrate relaxed atomic configurations of the above-mentioned models obtained by structural relaxation. In a-IGZO+H (FIG. 1A), the hydrogen added as an impurity forms a bond with oxygen existing in the pure a-IGZO model (O(A) in the figure). In a-IGZO+O (FIG. 1B), the oxygen $O_{EX}$ added as excess oxygen forms an O—$O_{EX}$ bond with oxygen existing nearby in the pure a-IGZO model (O(A) in the figure). In a-IGZO+OH (FIG. 1C) and a-IGZO+OH$_2$ (FIG. 1D), the excess oxygen maintains the O—O$_{EX}$ bond, and the added hydrogen forms a bond with oxygen existing nearby in the pure a-IGZO model. On the other hand, in a-IGZO+O$_{EX}$H (FIG. 1E) and a-IGZO+O$_{EX}$H$_2$ (FIG. 1F), the hydrogen located near the excess oxygen breaks the O—O$_{EX}$ bond, and an O$_{EX}$—H—O bond or an H—O$_{EX}$—H bond is formed between the excess oxygen and the hydrogen. In particular, from FIG. 1F illustrating a-IGZO+O$_{EX}$H$_2$, it may be seen that the structure of H—O$_{EX}$—H is similar to that of water.

Figure 2A:
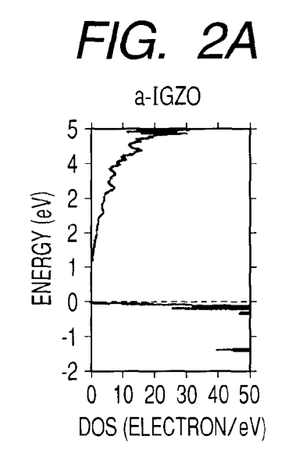
FIGS. 2A, 2B, 2C, 2D, 2E, 2F, and 2G illustrate density of states (DOS) obtained by calculation with regard to the models illustrated in FIGS. 1A to 1F using cut-off energy of 400 eV and a 4×5×6 Monkhost-Pack special k-point mesh.
Figure 2B:
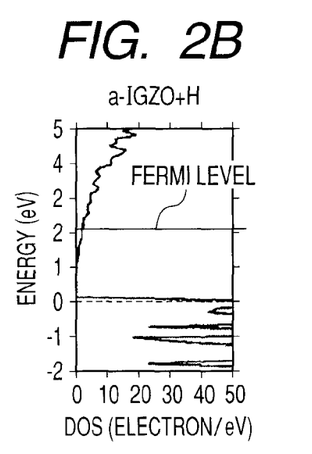
Figure 2C:
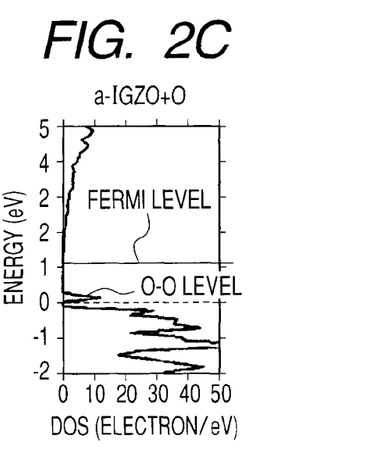
Figure 2D:
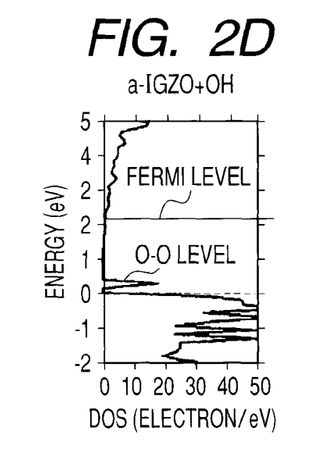
Figure 2E:
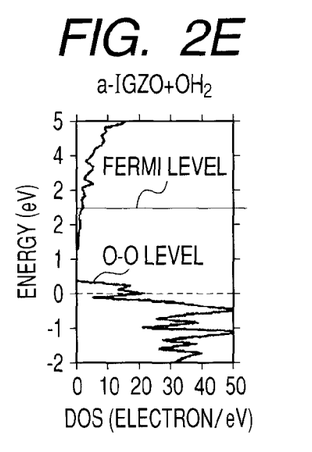
Figure 2F:
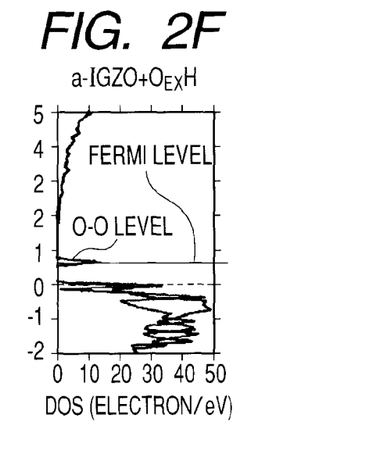
Figure 2G:
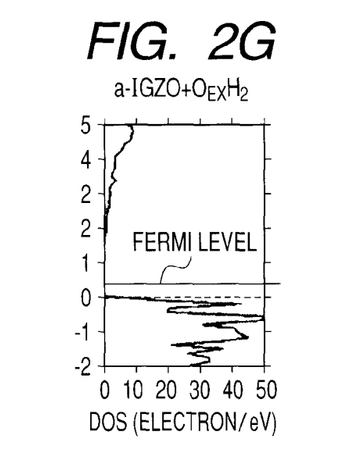

FIGS. 2A to 2G illustrate DOS obtained with regard to the above-mentioned models. Further, for comparison purposes, DOS of the pure a-IGZO is illustrated (FIG. 2A). In these figures, the top energy of the valence band of pure a-IGZO is 0 eV. A solid line in the figures designates the Fermi level. In the DOS of a-IGZO+H (FIG. 2B), the Fermi level is in the conduction band. This means that electrons as carriers are doped in the conduction band, which is coincident with the fact that hydrogen behaves as a donor. In the DOS of a-IGZO+O (FIG. 2C), the Fermi level does not exist in the conduction band. Further, a level peak which comes from the O—O bond is observed above the valence band. Because the level is completely occupied by electrons, the excess oxygen does not affect the electrical characteristics of an n-type TFT. In the DOS of a-IGZO+OH (FIG. 2D) and a-IGZO+OH$_2$ (FIG. 2E) in which the a-IGZO+O structural model has hydrogen added thereto at a location far from the excess oxygen, a peak which comes from the O—O$_{EX}$ bond is observed above the valence band, and the Fermi level is in the conduction band. The excess oxygen and the hydrogen exhibit their respective characteristics independently of each other, which shows that there is a case in which, even when excess oxygen exists, the excess oxygen does not function as carrier killers. On the other hand, in the DOS of a-IGZO+O$_{EX}$H (FIG. 2F) in which the a-IGZO+O structural model has hydrogen added thereto at a location near the excess oxygen, a steep peak of the O—H—O$_{EX}$ bond which comes from the excess oxygen and the hydrogen is observed in the band gap. Therefore, judging from the location of the Fermi level, it may be seen that the level is an incompletely occupied level. Thus, the level acts as a trap for capturing carrier electrons. In the DOS of a-IGZO+O$_{EX}$H$_2$ (FIG. 2G), the level in the gap observed in a-IGZO+O$_{EX}$H (FIG. 2F) disappears, the Fermi level does not exist in the conduction band, and the DOS is similar to that of pure a-IGZO. Therefore, in this case, the hydrogen cannot be an impurity which greatly affects the electrical characteristics of the TFT.

From the above, the reason for the fact that, while the experimental fact shows that hydrogen in an amorphous oxide semiconductor functions as a donor, the concentration of hydrogen atoms existing in the film is not in good agreement with the carrier electron density is thought to be as follows. A case in which hydrogen is introduced by ion implantation into an amorphous oxide semiconductor thin film corresponds to the above-mentioned case of a-IGZO+H, and the hydrogen is ionized to function as a donor. On the other hand, it is suggested that, in a thin film formed with the partial pressure of oxygen or the partial pressure of water being controlled, most hydrogen existing in the film does not function as a donor. From the above-mentioned calculation, when excess oxygen having the composition ratio different from its stoichiometric composition ratio in a-IGZO and hydrogen form a chemical bond of O—H—O$_{EX}$ or O$_{EX}$—H$_2$, the hydrogen does not function as a donor. In this case, O—H—O$_{EX}$ functions as a carrier trap while O$_{EX}$—H$_2$ does not affect the electrical characteristics of the TFT. Therefore, it is thought that, in a formed film, because a large ratio of existing hydrogen exists in a bonding state of O—H—O$_{EX}$ or O$_{EX}$—H$_2$, a carrier electron density which attains a normally off TFT device is maintained.

The excess oxygen as used herein does not mean that the oxygen is excessive compared with its stoichiometric composition ratio in the entire amorphous oxide semiconductor, but means that the oxygen is excessive in a minute region with a specific number of atoms in a part of the amorphous oxide semiconductor as a unit size. Therefore, even when the oxygen exists according to its stoichiometric composition ratio in the entire amorphous oxide semiconductor, if the amount of oxygen deficiency and the amount of excess oxygen are to the same extent, there is the excess oxygen as used herein.

Specifically, the existence of excess oxygen means that, though oxygen is to be bonded with a metallic element M (where M is In, Zn, or Ga) and the bonding state is to be M-O-M, the bonding state is actually M-O—O-M including O—O. This bonding state of oxygen is expressed as O—O$_{EX}$ bond. When hydrogen is bonded to this O—O$_{EX}$ bond, the bonding state is expressed as O$_{EX}$—H or H—O$_{EX}$—H.

An O—H bond as used herein means the a-IGZO+OH bond described above. Further, an O$_{EX}$—H bond formed by excess oxygen compared with its stoichiometric composition ratio in relation to a metallic element and by hydrogen means the a-IGZO+O$_{EX}$H bond described above having the structure in which hydrogen is inserted into the O—O$_{EX}$ bond of the excess oxygen. Further, an H—O$_{EX}$—H bond formed by excess oxygen and hydrogen means the a-IGZO+O$_{EX}$H$_2$ bond described above.

As described above, it has been found that hydrogen in an amorphous oxide semiconductor does not function as a donor when oxygen near the hydrogen is locally excessive. Specifically, in an amorphous oxide semiconductor containing excess hydrogen in relation to the carrier density, the number of the a-IGZO+OH bonds which are the source of the carriers determines the final carrier density of the amorphous oxide semiconductor. In other words, the density of the O—H bonds is the carrier density.

When a large amount of ($1 \times 10^{20}$ cm$^{-3}$ or more) hydrogen atoms are contained in the amorphous oxide semiconductor, it is important that the ratio of the number of the excess oxygen atoms to the number of the hydrogen atoms is 1:2 or more when the excess oxygen atoms and the hydrogen atoms are taken in the amorphous oxide semiconductor. In this way, $5 \times 10^{19}$ cm$^{-3}$ or more excess oxygen atoms may be contained and the carrier density may be $1 \times 10^{18}$ cm$^{-3}$, which is sufficient to function as a channel layer semiconductor of a TFT. When the number of the hydrogen atoms is less than $1 \times 10^{20}$ cm$^{-3}$, because the carrier density due to a source of carriers other than the hydrogen, such as oxygen deficiency, competes with the carrier density due to the O—H bond (the difference in density becomes smaller), there is a case in which the relationship according to the present invention does not hold (the density of the O—H bond falls out of the range according to the present invention), which is not preferable.

Figure 3:
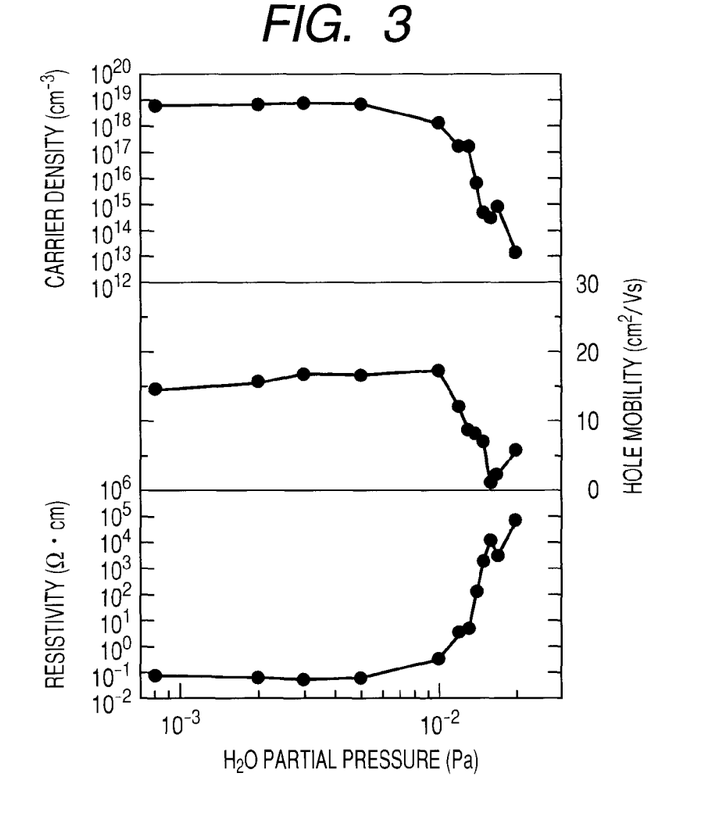
FIG. 3 is a graph illustrating a relationship between carrier density, Hall mobility, and resistivity and partial pressure of water vapor when a film is formed by sputtering, obtained by measuring a Hall effect of a-IGZO.

Further, when a large amount of ($1 \times 10^{21}$ cm$^{-3}$ or more) hydrogen atoms are contained in the amorphous oxide semiconductor, the concentration of O—H—O$_{EX}$ which functions as a carrier trap increases. In order to suppress the increase of the trap, it is more important not to add oxygen but to add only water vapor to Ar gas as the sputtering gas. As an example, the sputtering gas may be formed by adding only water vapor to Ar gas. FIG. 3 illustrates the dependence of the carrier density, the Hall mobility, and the resistivity on the partial pressure of water vapor when a film is formed by sputtering, obtained by measuring the Hall effect of a-IGZO prepared according to this embodiment. Depending on the film forming conditions by sputtering such as the gas pressure and the density of the applied power, by introducing a partial pressure of water vapor of $1\times10^{-2}$ Pa or higher, the resistivity of a-IGZO may be increased. Further, the carrier density may be made to be $1\times10^{18}$ cm$^{-3}$ or less. The upper limit of the amount of the hydrogen is $1\times10^{22}$ cm$^{-3}$. The upper limit is set because it is difficult to supply with stability more hydrogen by water vapor to the amorphous oxide semiconductor thin film. Further, because the density of O—H—O$_{EX}$ which functions as a carrier trap becomes higher, it is impossible to obtain electrical characteristics which are necessary for the TFT to operate. For example, the threshold value of the TFT becomes extremely high.

Figure 4:
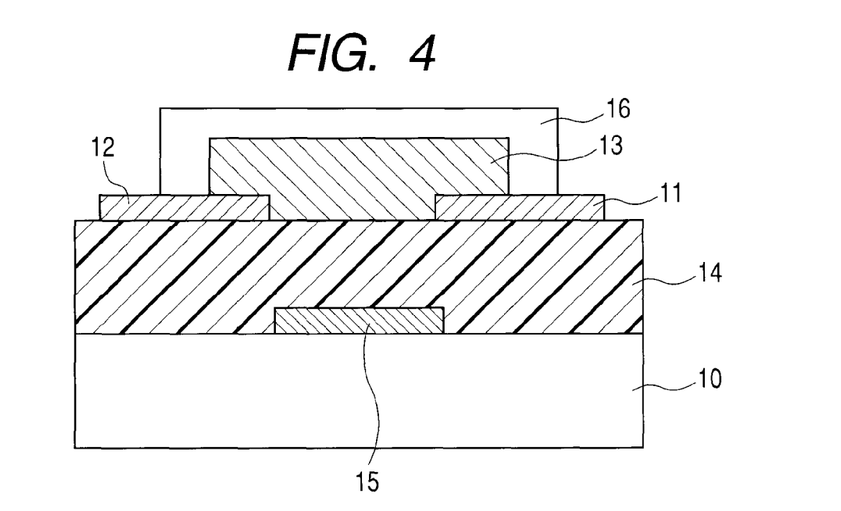
FIG. 4 is a schematic sectional view of a thin film transistor according to an embodiment of the present invention.

FIG. 4 is a schematic view of a structure of a TFT device prepared according to this embodiment. The TFT device is formed by providing on a substrate 10 a gate electrode 15, a gate insulating film 14, a source electrode and a drain electrode 11, a channel layer 13, and a protective layer 16 in this order.

The structure of the semiconductor device applicable to the present invention is not limited to the TFT of the bottom gate structure as described above. For example, the TFT may have a reverse stagger structure in which a gate insulating film and a semiconductor channel layer are provided in this order on a gate electrode and then a source electrode and a drain electrode are formed thereon or may have a stagger structure (top gate structure) which is an upside-down reverse stagger structure.

According to findings by the inventors of the present invention, it is preferable that a thin film transistor in which an amorphous oxide semiconductor layer containing hydrogen and at least one element of In and Zn is used as a channel layer have, depending on the composition, the following characteristics: when a semi-insulating oxide film having an electrical resistivity of more than about 10 Ωcm and less than about $1\times10^6$ Ωcm is used, satisfactory TFT characteristics may be obtained. For example, when the electrical resistivity is 10 Ωcm or less, it is impossible to obtain a normally-off transistor or a large on/off ratio. In extreme cases, even when gate voltage is applied, current between the source and drain electrodes is not turned on/off, and the transistor does not operate. On the other hand, when the electrical resistivity is $1\times10^6$ Ωcm or more, it is impossible to obtain a large on-current. In extreme cases, even when gate voltage is applied, current between the source and drain electrodes is not turned on/off, and the transistor does not operate.

Normally, the electrical resistivity and the carrier density of an oxide are controlled by the partial pressure of oxygen which is introduced when the film is formed. More specifically, by controlling the partial pressure of the oxygen, mainly the amount of oxygen deficiency in the thin film is controlled, by which the electron carrier density is controlled. However, according to the present invention, the electron carrier density is controlled by controlling only the partial pressure of water vapor illustrated in FIG. 3.

A method of forming the channel layer according to the present invention is described in detail below.

First, the substrate 10 made of glass or the like is prepared. By a vapor phase method such as DC sputtering, RF sputtering, pulsed-laser deposition, atomic layer deposition, or electron beam deposition, a combination thereof, or the like, the amorphous oxide semiconductor film is formed. Here, the film is formed under such a condition that the electrical resistivity of the amorphous oxide semiconductor film is higher than a resistivity with which satisfactory characteristics for a TFT channel layer are obtained. This is accomplished basically by, depending on the composition of the amorphous oxide semiconductor film and the film forming apparatus, setting the partial pressure of the introduced water vapor in a range which is $8\times10^{-4}$ Pa or higher. In particular, when the partial pressure of the introduced water vapor is $1\times10^{-2}$ Pa or higher, this may be accomplished easily. When the film is formed using a vacuum apparatus, the upper limit of the partial pressure of the introduced water vapor is the pressure of the film forming gas. In order to prevent decreased density of the film and decreased speed of film formation due to polymerization in a vapor phase, the partial pressure of the introduced water vapor is desirably about 10 Pa or lower. In order to strictly control the resistivity, water vapor and oxygen the amount of which is small compared with that of the water vapor may be simultaneously introduced and controlled.

The partial pressure of the introduced water vapor as used herein means the partial pressure of water vapor which is intentionally introduced into the film forming apparatus by a flow rate controller. Water vapor which is inevitably released from an inner wall of the film forming apparatus or the like, water vapor which enters from the outside because the film forming apparatus leaks, and water vapor released from a target greatly vary depending on the history of the film formation, and thus, are very difficult to control. It is technically possible to make the back pressure of the vacuum film forming apparatus an ultrahigh vacuum of $1\times10^{-8}$ Pa or lower and to control the concentration of hydrogen in the amorphous oxide to be less than the carrier density. However, if this is done, a problem that the manufacturing cost is increased arises including increased cost of the film forming apparatus and a lengthened manufacturing tact time. However, when the pressure of residual water vapor exceeds the upper limit of the partial pressure of the introduced water vapor, it is difficult to obtain the effect of the present invention, and thus, it is preferable that the back pressure of the film forming apparatus used in the present invention be $5\times10^{-4}$ Pa or lower. It is to be noted that the flow rate controller is, for example, a mass flow controller.

Further, here, from the viewpoint of the performance of the TFT device, it is preferable that the film be formed under such a condition that the resistivity of the amorphous oxide semiconductor film is $1\times10^2$ Ωcm or more. It is to be noted that, according to the present invention, the lower limit of the resistivity after the metallic film is formed is, depending on the composition and the film forming conditions of the oxide film, $1\times10$ Ωcm or more, for example.

After that, the prepared amorphous oxide semiconductor film may be thermally treated. Here, the thermal treatment conditions are set such that the amorphous oxide semiconductor film has a resistivity with which satisfactory characteristics for a TFT channel layer are obtained. In order to control the resistivity uniformly in a short time, the thermal treatment may be carried out with the temperature of the atmosphere being 150° C. or higher to 500° C. or lower, preferably 200° C. or higher to 350° C. or lower. Further, to use an oxidizing atmosphere is effective from the viewpoint of uniformity, and thus, this is also preferable.

When the thermal treatment is carried out, the following are thought to happen: the hydrogen atoms are thermally diffused in the amorphous oxide; the diffused hydrogen is bonded to O—H—O$_{EX}$ which functions as a carrier trap to produce O$_{EX}$—H$_2$ which does not affect the electrical characteristics of the TFT; and the carrier trap density is decreased.

A preferable method of forming the TFT at low cost is to form an amorphous oxide semiconductor film by applying a solution. For example, first, a solution of $Zn(CH_3COO)_2 2H_2O$ (available from Aldrich) and $In(CH_3COO)_3$ (available from Aldrich) dissolved in 2-methoxyethanol as a solvent is applied by inkjet printing as the material. Then, thermal treatment is carried out in the atmosphere at a temperature of 500° C. or lower to obtain an amorphous InZnO film. In order to sufficiently volatilize the solvent, the thermal treatment may be carried out at 150° C. or higher to 500° C. or lower, preferably at 200° C. or higher to 350° C. or lower. The upper limit of the temperature of the thermal treatment is restricted by crystallization of the oxide semiconductor film. Here, $1 \times 10^{20}$ cm$^{-3}$ or more hydrogen atoms remain in the amorphous oxide semiconductor film, and the number of M-OH bonds of $1 \times 10^{18}$ cm$^{-3}$ or less which materializes the carrier density of the present invention may be materialized. Electrodeposition may be employed as a method of forming the film using another solvent. For example, with an aqueous solution containing indium nitrate, gallium nitrate, zinc nitrate, and dimethylamine-borane (DMAB) being used as the material, an In—Ga—Zn—O-based amorphous oxide thin film may be formed on an insulating substrate (for example, Corning 1737). After an initial deposited layer is deposited without an electric field applied thereto, an electric field may be applied using an aqueous solution which does not contain dimethylamine-borane (DMAB) and using an external power supply to form an amorphous oxide film by electrodeposition. Here, the temperature of the aqueous solution is 60° C. The amorphous oxide film formed in this way has therein a large amount of ($1 \times 10^{20}$ cm$^{-3}$ or more) residual hydrogen atoms. By thermally treating the film at 500° C. or lower, the number of M-OH bonds of $1 \times 10^{18}$ cm$^{-3}$ or less and the carrier density of $1 \times 10^{18}$ cm$^{-3}$ or less in the present invention may be materialized. In this way, an amorphous oxide semiconductor film which may operate as a TFT may be formed. In order to volatilize a large amount of moisture contained in the film, the thermal treatment may be carried out at 150° C. or higher to 500° C. or lower, preferably at 200° C. or higher to 350° C. or lower. The upper limit of the temperature of the thermal treatment is restricted by crystallization of the oxide semiconductor film.

Then, an oxide insulator protective film is formed by sputtering in an atmosphere containing oxygen, by which damage to the channel layer due to the formation of the protective film and an effect of reduction may be cancelled out.

Components of the TFT structure are described in detail below.

(Gate Insulating Layer)

In the present invention, it is desirable to use $SiO_2$ for the gate insulating layer. Alternatively, it is also preferable to use a material containing at least one kind of $SiO_2$, $Y_2O_3$, $Al_2O_3$, $HfO_2$ and $TiO_2$ for the gate insulating layer. Any film in which these layers are laminated may also be used.

As the film formation method for a gate insulating layer, vapor phase methods such as sputtering, pulsed-laser deposition and electron beam deposition may be used. However, the film formation method is not limited to these methods.

(Electrode)

The materials for the source electrode, the drain electrode and the gate electrode are not particularly constrained as long as the materials enable satisfactory electrical conductance and satisfactory electrical connection to the channel layer. For example, usable are transparent conductive films formed of $In_2O_3$:Sn or ZnO, and metal films formed of Mo, Au, Pt, Al Ni, and Cu. In addition, for the purpose of improving adhesion, a layer formed of Ti, Ni, Cr, and the like may be disposed between the channel layer or the insulating layer and the electrodes.

(Substrate)

As the substrate, a glass substrate, a metal substrate, a plastic substrate, a plastic film, and the like may be used, depending on the thermal treatment conditions of the channel layer, and the like.

(Channel Layer)

The channel layer is an amorphous oxide containing hydrogen and at least one element of In and Zn.

As the film formation method for a channel layer, vapor phase methods such as sputtering, pulsed-laser deposition and electron beam deposition may be used. However, the film formation method is not limited to these methods.

In order to ensure that a fixed amount of hydrogen is taken in the amorphous oxide semiconductor, and thus, in order to prevent water vapor from being adsorbed to an underlayer of the channel layer or to a wall of the chamber of the vacuum apparatus before the film formation is started, it is desirable that the channel layer be formed at 80° C. or higher.

It is desirable that the temperature of the thermal treatment be equal to or lower than a glass transition temperature, and, in the present invention, it is desirable that the temperature of the thermal treatment be 150° C. or higher to 500° C. or lower. The lower limit of the temperature of the thermal treatment is 150° C. because decomposition of $In(OH)_3$ which is a well-known material used when metallic indium is refined therefrom begins at 150° C. From the viewpoint of shortening the thermal treatment time, it is preferable that the temperature of the thermal treatment be 200° C. or higher to 350° C. or lower.

Because the thermal treatment may be carried out by utilizing the temperature at which the channel layer is formed, the thermal treatment may be carried out simultaneously with the formation of the channel layer. Also, the thermal treatment may be carried out after the protective film is formed, or, may be carried out after the TFT is completed.

(Protective Film)

As the protective film, a metal oxide film containing at least one kind of metal element is used. Of metal oxides, it is preferred to use, as the protective film, a substance containing at least one of the following: $SiO_2$, $Al_2O_3$, $Ga_2O_3$, $In_2O_3$, MgO, CaO, SrO, BaO, ZnO, $Nb_2O_5$, $Ta_2O_5$, $TiO_2$, $ZrO_2$, $HfO_2$, $CeO_2$, $Li_2O$, $Na_2O$, $K_2O$, $Rb_2O$, $Sc_2O_3$, $Y_2O_3$, $La_2O_3$, $Nd_2O_3$, $Sm_2O_3$, $Gd_2O_3$, $Dy_2O_3$, $Er_2O_3$ and $Yb_2O_3$.

Alternatively, silicon nitroxide ($SiO_xN_y$) may also be used, in addition to these metal oxides.

As the method of forming the above-mentioned metal oxide or $SiO_xN_y$ as the protective film on the TFT, chemical vapor deposition (CVD), sputtering, and the like may be used. When the protective film is formed by sputtering, the film formation is conducted during sputtering in an oxygen-containing atmosphere. This is because a device, in which the protective film is formed, for example, in an Ar gas atmosphere, is degraded in TFT characteristics as compared to before formation of the protective film. The cause for the degradation of the TFT characteristics is conceivably the decrease in resistance of the channel layer by the carrier generation due to the oxygen release from the interface of the channel layer during formation of the protective film. Consequently, the film formation is required to be conducted in an oxygen-containing atmosphere during sputtering the protective film. The oxygen content in the total sputtering gas is desirably 10% to 80%.

(TFT Characteristics)

Figure 5:
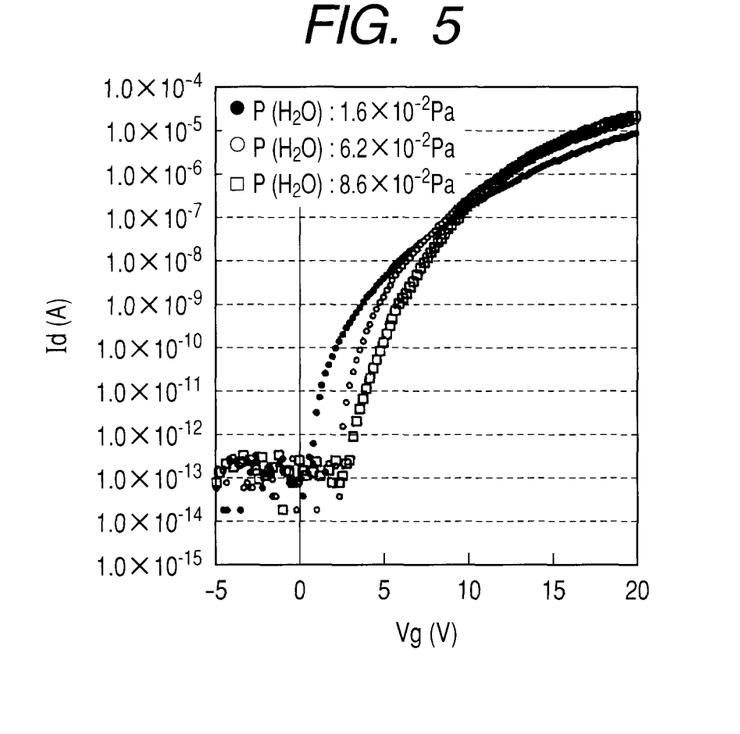
FIG. 5 is a graph illustrating transfer characteristics of the thin film transistor according to the embodiment of the present invention.

FIG. 5 illustrates the typical transfer characteristic (Vg-Id characteristic) of the TFT of the present invention. When a voltage Vd of 12 V is applied between the source and drain electrodes, by sweeping the gate voltage Vg between −20 V and 20 V, the current Id between the source and drain electrodes may be controlled (turned on and off).

In particular, when the present invention is applied to a TFT using, as a channel layer, an amorphous oxide having a high carrier mobility originally due to no grain boundary scattering and excellent interface characteristics, a TFT having a high field-effect mobility and excellent characteristics may be actualized. In this case, the amorphous phase is stabilized by incorporating at least one element of Ga and Sn in the oxide film. In addition, from the viewpoint of the stabilization of the amorphous phase, it is conceivable that the temperature of the oxidizing atmosphere at the time of the thermal treatment is preferably set at 500° C. or lower.

Here, the state of being amorphous may be identified by the observation that no distinct diffraction peaks are detected (in other words, halo patterns are observed) when X-ray is diffracted to a thin film, as a measurement target, with a low incidence angle of approximately 0.5 degrees. It should be noted that when the above-mentioned materials are used for the channel layer of a thin film transistor, the present invention does not exclude the case where the channel layer contains microcrystalline-state constituent materials.

By connecting an electrode of a display device such as an organic or inorganic electroluminescent (EL) device or a liquid crystal device to a drain which is an output terminal of the above-mentioned thin film transistor, a display apparatus may be formed. Specific examples of display apparatus structures are described below with reference to sectional views of display apparatus.

Figure 6:
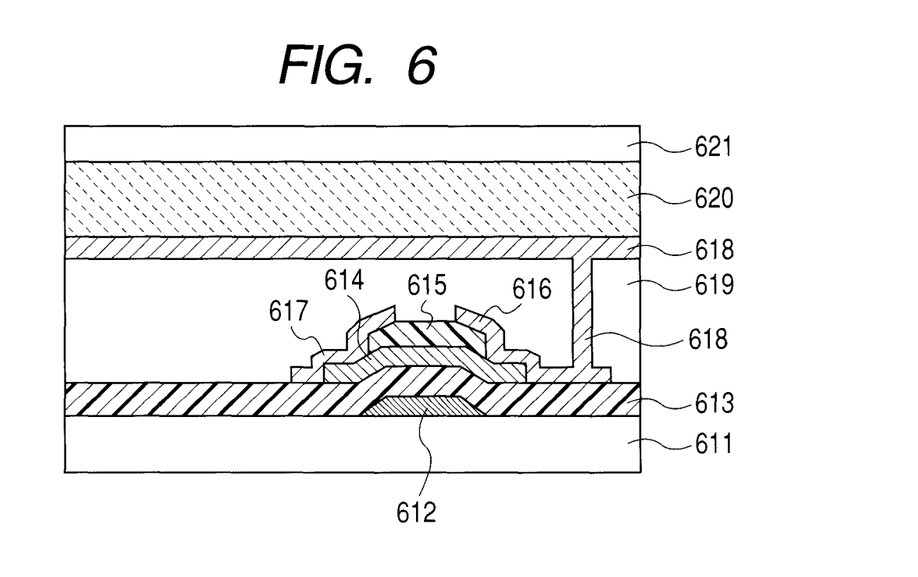
FIG. 6 is a sectional view of an example of a display apparatus according to another embodiment of the present invention.

FIG. 6 is a sectional view of an exemplary display apparatus as another embodiment of the present invention. A TFT is formed on a substrate 611. The TFT includes a gate electrode 612, a gate insulating film 613, an amorphous oxide semiconductor film 614, a protective layer 615, a source (drain) electrode 616, and a drain (source) electrode 617.

An electrode 618 is connected to the drain (source) electrode 617 via an interlayer insulating film 619. The electrode 618 is in contact with an emission layer 620. The emission layer 620 is in contact with an electrode 621.

With such a structure, current injected into the emission layer 620 may be controlled by a value of current which passes from the source (drain) electrode 616 to the drain (source) electrode 617 via a channel formed in the amorphous oxide semiconductor film 614.

Therefore, the current may be controlled by the voltage at the gate electrode 612 of the TFT. Here, the electrode 618, the emission layer 620, and the electrode 621 form an inorganic or organic electroluminescent device.

Figure 7:
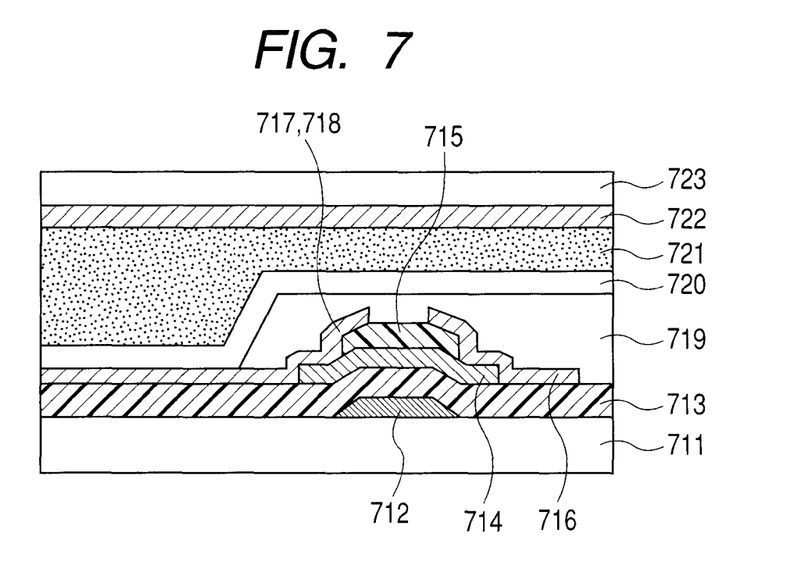
FIG. 7 is a sectional view of another example of the display apparatus according to the another embodiment of the present invention.

FIG. 7 is a sectional view of another exemplary display apparatus as the another embodiment of the present invention. A drain (source) electrode 717 is extended so as to also serve as an electrode 718. An electrode 723 and opposite electrode 718 may be structured to apply voltage to a liquid crystal cell or an electrophoretic particle cell 721 sandwiched between high resistance films 720 and 722. FIG. 7 also illustrates a substrate 711, a gate insulating film 713, a protective layer 715, and an interlayer insulating film 719.

The liquid crystal cell or electrophoretic particle cell 721, the high resistance films 720 and 722, the electrode 718, and the electrode 723 form a display device.

Voltage applied to the display device may be controlled by a value of current which passes from a source electrode 716 to the drain electrode 717 via a channel formed in an amorphous oxide semiconductor film 714.

Therefore, the voltage may be controlled by the voltage at a gate electrode 712 of the TFT. Here, when a display medium of the display device is a capsule having fluid and particles encapsulated in an insulating film thereof, the high resistance films 720 and 722 may be eliminated.

The two example TFTs have been described above as TFTs having a bottom gate reverse stagger structure, but the present invention is not limited to such a structure.

For example, as long as the connection between the drain electrode which is an output terminal of the TFT and the display device is topologically the same, other structures such as a coplanar structure are also possible.

Further, in the two example TFTs described above, the electrodes in a pair for driving the display device are provided so as to be in parallel with the substrate, but the present invention is not limited to such a structure.

For example, as long as the connection between the drain electrode which is an output terminal of the TFT and the display device is topologically the same, one or both of the electrodes may be provided so as to be perpendicular to the substrate.

Still further, with regard to the two example TFTs described above, only one TFT is illustrated to be connected to the display device, but the present invention is not limited to such a structure. For example, the TFT illustrated in the figures may be further connected to another TFT according to the present invention, as long as the TFT illustrated in the figures is at the last stage of a circuit including these TFTs.

Here, when the electrodes in a pair for driving the display device are provided so as to be in parallel with the substrate, if the display device is a reflective display device such as an EL device or a reflective liquid crystal device, any one of the electrodes is required to be transparent with respect to the wavelength of emitted light or of reflected light.

If the display device is a transmissive display device such as a transmissive liquid crystal device, both of the electrodes are required to be transparent with respect to transmitted light.

Further, in the TFT according to this embodiment, all the components may be transparent so that a transparent display device may be formed.

Further, such a display device may be provided on a substrate which has low heat resistance, such as a lightweight, flexible, and transparent plastic resin substrate.

Next, a display apparatus in which a plurality of pixels including EL devices (here, organic EL devices) and thin film transistors are disposed two-dimensionally is described with reference to FIG. 8.

Figure 8:
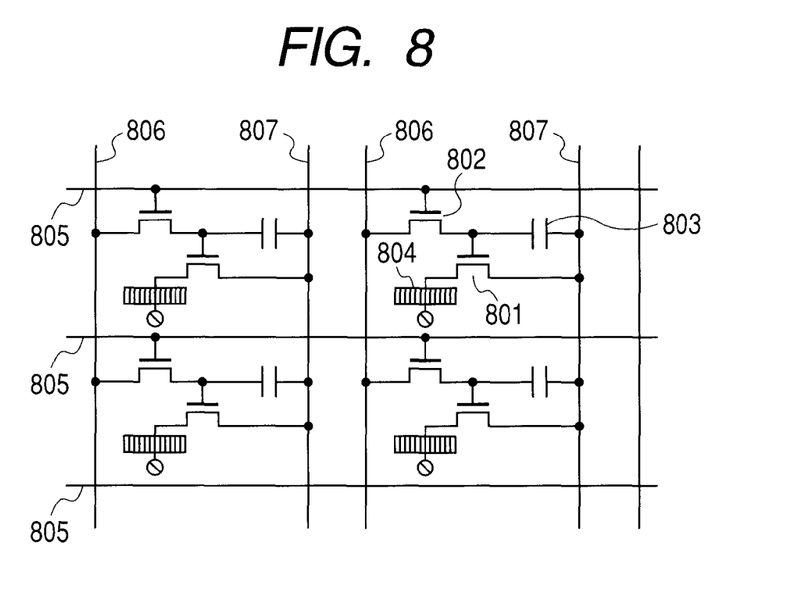
FIG. 8 illustrates a structure of a display apparatus in which pixels including organic electroluminescent (EL) devices and thin film transistors are disposed two-dimensionally according to the another embodiment of the present invention.

In FIG. 8, a transistor 801 drives an organic EL layer 804. A transistor 802 selects a pixel. A capacitor 803 maintains a selected state, holds charge between a common electrode line 807 and a source of the transistor 802, and holds a signal at a gate of the transistor 801. A pixel is selected through a scanning electrode line 805 and a signal electrode line 806.

More specifically, an image signal is applied as a pulse signal from a driver circuit (not shown) via the scanning electrode line 805 to a gate electrode. At the same time, a signal is applied also as a pulse signal from another driver circuit (not shown) via the signal electrode line 806 to the transistor 802 to select a pixel. Here, the transistor 802 is turned on and charge is stored in the capacitor 803 between the signal electrode line 806 and the source of the transistor 802.

This makes the gate of the transistor 801 held at a desired voltage and the transistor 801 is turned on. This state is maintained until the next signal is received.

During a time period in which the transistor 801 is on, voltage and current continue to be supplied to the organic EL layer 804 and light emission is maintained.

Although the structure illustrated in FIG. 8 has two transistors and one capacitor per pixel, more transistors and the like may be incorporated in order to improve the performance.

What is essential is that, by using an In—Ga—Zn—O-based TFT which is transparent and may be formed at a low temperature for the transistor part, an effective EL device may be obtained.

Although the present invention is further described below with reference to examples, the present invention is not limited thereto.

EXAMPLE 1

In this example, an embodiment of a TFT device of the present invention is described.

First, an In—Ga—Zn—O film was formed on a glass substrate as an amorphous oxide semiconductor. The In—Ga—Zn—O film was formed in an argon atmosphere by DC sputtering film formation.

As a target (material source), a 3-inch sized sintered body having a composition of $InGaZnO_4$ was used, and the applied RF power was 50 W. The distance between the target and the substrate was 60 mm. The In—Ga—Zn—O film was formed in a mixed atmosphere at $5.0 \times 10^{-1}$ Pa of argon and water vapor. The partial pressure of the introduced water vapor was $8.0 \times 10^{-4}$ to $6.0 \times 10^{-2}$ Pa. Note that oxygen was not introduced. The substrate temperature at the time of film formation was 25° C.

With regard to the obtained film, the Hall effect was measured. The result is illustrated in FIG. 3, in which the dependence of the carrier density, the Hall mobility, and the resistivity of the In—Ga—Zn—O film on the partial pressure of water vapor when the film was formed by sputtering is illustrated. By introducing a partial pressure of water vapor of $1 \times 10^{-2}$ Pa or higher, the resistivity of the In—Ga—Zn—O film could be increased. Further, the carrier density could be made to be $1 \times 10^{18}$ cm$^{-3}$ or less. With regard to the In—Ga—Zn—O film, X-ray diffraction was carried out with the incident angle upon a film surface being as small as about 0.5 degrees. With regard to all the cases, no clear diffraction peak was observed, and it was confirmed that the prepared In—Ga—Zn—O film was an amorphous film. Further, AFM measurement was performed and the pattern was analyzed to find that the surface roughness (Ra) of the thin film was about 0.4 nm. The film thickness was about 200 nm. As a result of X-ray photoelectron spectroscopy (XPS) analysis, it was found that the composition ratio of the metals in the thin film was In:Ga:Zn=1:1:0.9.

Further, a 3-inch sized sintered body of InZnO (ZnO: 10.7 wt %) was used as the target (material source) and similar experiment was carried out. By introducing a partial pressure of water vapor of $1 \times 10^{-2}$ Pa or higher, the resistivity of the InZnO film could be increased, and an amorphous IZO film could be obtained.

Figure 10:
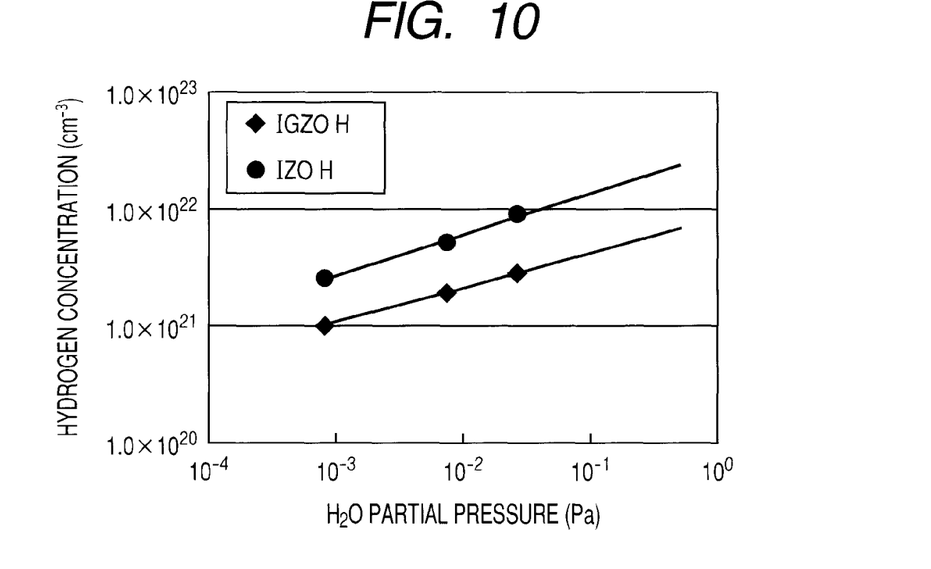
FIG. 10 is a graph illustrating a relationship between an amount of hydrogen in an amorphous oxide semiconductor film prepared in Example 1 and a partial pressure of water vapor in a sputtering gas.

With regard to the obtained amorphous In—Ga—Zn—O film and the IZO film, secondary ion mass spectrometry (SIMS) measurement was performed to quantify the amount of hydrogen in the films. The result is illustrated in FIG. 10. It was found that, in the films, according to the partial pressure of the introduced water vapor, hydrogen of $1 \times 10^{21}$ to $1 \times 10^{22}$ cm$^{-3}$, which is more than $1 \times 10^{20}$ cm$^{-3}$ according to the present invention, was contained. Further, because the double logarithmic plot of the amount of hydrogen in the film and the partial pressure of the introduced water vapor exhibits very good linearity, it was found that the amount of hydrogen in the film could be precisely controlled by the partial pressure of the introduced water vapor.

EXAMPLE 2

Figure 9:
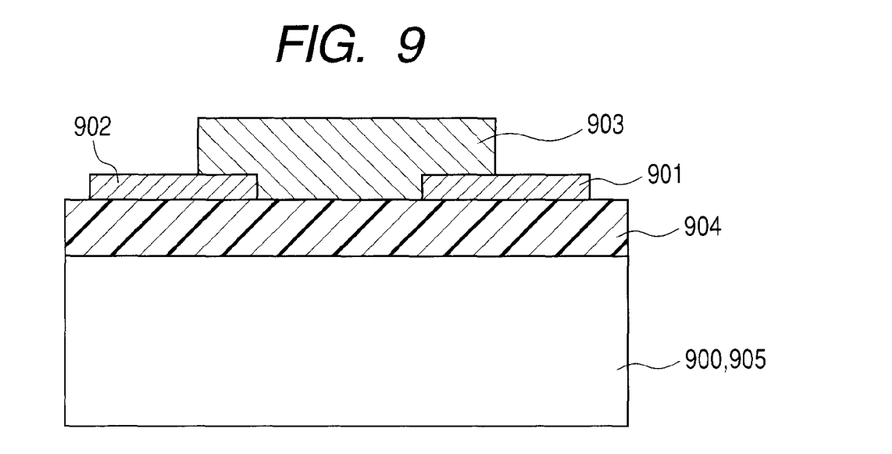
FIG. 9 is a schematic sectional view illustrating a thin film transistor according to another embodiment of the present invention.

In this example, another embodiment of a TFT device of the present invention is described with reference to FIG. 9.

First, as a channel layer, an In—Ga—Zn—O film 903 was formed on an n-type low resistance silicon substrate 900 having a thermally grown silicon oxide film 904 at a thickness of 100 nm formed thereon. By DC sputtering in an argon atmosphere, the In—Ga—Zn—O film was formed.

As the target (material source), a 3-inch sized sintered body having a composition of $InGaZnO_4$ was used, and the applied RF power was 50 W. The distance between the target and the substrate was 60 mm. The In—Ga—Zn—O film was formed in an atmosphere of argon-water vapor mixed gas at $5.0 \times 10^{-1}$ Pa with the partial pressure of the introduced water vapor being $6.2 \times 10^{-2}$ Pa. It is to be noted that oxygen was not introduced. The temperature of the substrate when the film was formed was 25° C. The thickness of the amorphous $InGaZnO_4$ channel layer was 30 nm. After that, the channel layer was patterned by photolithography. Then, electron beam heating vapor deposition was used to laminate a Ti layer at a thickness of about 5 nm and an Au layer at a thickness of about 100 nm from a side nearer to the channel layer in this order, and a source electrode 902 and a drain electrode 901 were formed by photolithography and lift-off. In this way, a bottom gate reverse stagger TFT having a channel length of 30 μm and a channel width of 180 μm was completed. In this TFT device, the n-type low resistance silicon film 900 functions as a gate electrode 905 while the thermally grown silicon oxide film 904 at a thickness of 100 nm functions as a gate insulating layer.

Figure 11:
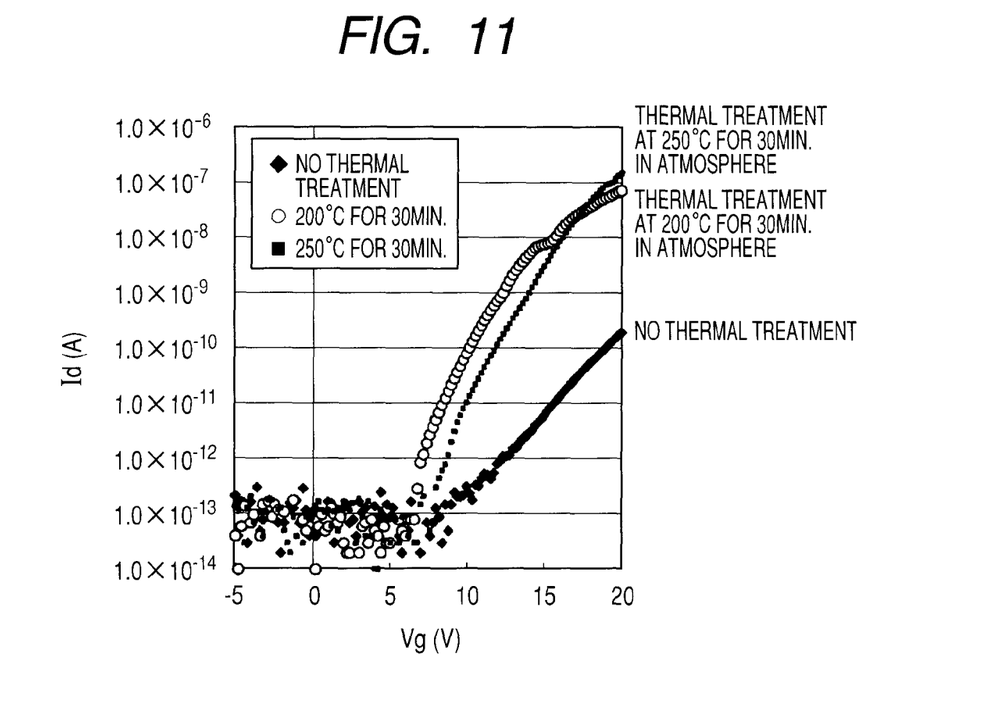
FIG. 11 is a graph illustrating transfer characteristics of a thin film transistor prepared in Example 2.

Next, characteristics of the TFT device obtained in this way were evaluated. FIG. 11 illustrates Id-Vg characteristics (transfer characteristics) of the TFT device prepared in this example, which were measured at room temperature when Vd=20 V with regard to a case with no thermal treatment after the TFT was formed, a case with thermal treatment at 200° C. for 30 minutes in the atmosphere, and a case with thermal treatment at 250° C. for 30 minutes. It was found that the resistivity of the amorphous $InGaZnO_4$ channel layer could be controlled only by the partial pressure of the water vapor, and that the TFT device had an on/off ratio comparable to a transistor and a TFT characteristic of $10^4$ or more.

EXAMPLE 3

In this example, another embodiment of a TFT device of the present invention is described with reference to FIG. 4.

First, an Mo electrode as a gate electrode was formed on a glass substrate 10 by sputtering. Then, patterning was carried out by photolithography. After an $SiO_2$ film as a gate insulating film 14 was formed by sputtering, a source electrode 12 and a drain electrode 11 were formed. Then, similarly to the case of Example 2, an In—Ga—Zn—O film was formed thereon as a channel layer 13. The thickness of the amorphous $InGaZnO_4$ channel layer was 30 nm. The partial pressure of the introduced water vapor was $1.6 \times 10^{-2}$ Pa, $6.2 \times 10^{-2}$ Pa, and $8.6 \times 10^{-2}$ Pa. It is to be noted that oxygen was not introduced. The temperature of the substrate when the film was formed was 25° C.

Further, an $SiO_2$ film as a protective film 16 was deposited thereon at a thickness of 100 nm by sputtering.

In this example, the applied RF power was 300 W. The atmosphere at the time of film formation was such that the total pressure was 0.1 Pa, and the gas flow rate ratio was $Ar:O_2=90:10$. The substrate temperature was 25° C.

Finally, contact holes were formed by removing a part on each of the gate electrode 15, the drain electrode 11, and the source electrode 12 by photolithography and etching. Then, thermal treatment was carried out at 250° C. for 60 minutes in the atmosphere. In this way, a bottom gate TFT having a channel length of 30 μm and a channel width of 180 μm was completed.

Next, characteristics of the thus obtained TFT device were evaluated. FIG. 5 is a graph illustrating the Id-Vg characteristics (transfer characteristics) at Vd=20 V of the TFT device produced in this example when the measurement was carried out at room temperature. A current of about $Id=1\times10^{-5}$ A flowed at Vd=20 V. In addition, the field-effect mobility was calculated from the output characteristics under the partial pressure of the introduced water vapor of $8.6\times10^{-2}$ Pa to yield a filed-effect mobility of approximately 3 $cm^2/Vs$ in the saturation region.

EXAMPLE 4

Figure 12:
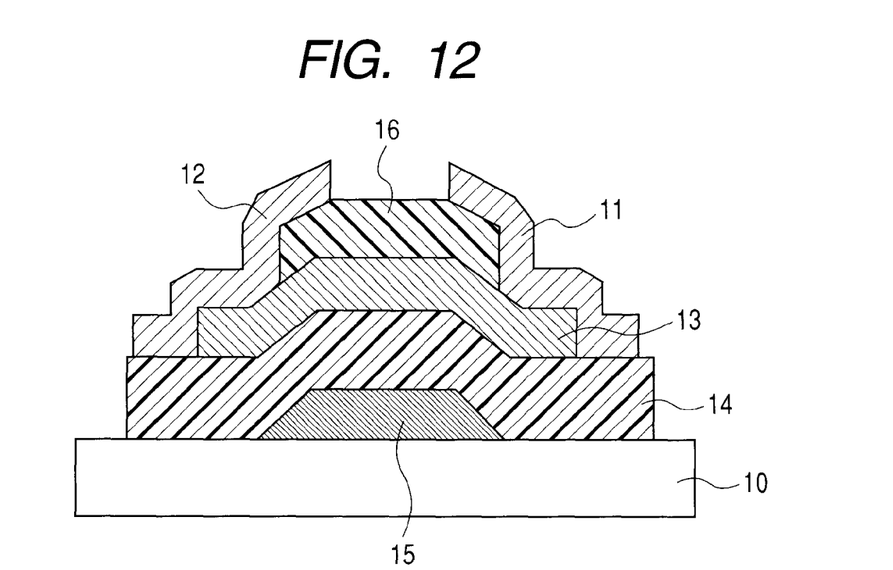
FIG. 12 is a schematic sectional view of a thin film transistor prepared in Example 4.

In this example, a display apparatus using a thin film transistor illustrated in FIG. 12 is described. The process of forming a channel layer in the thin film transistor used is similar to that in the case when the partial pressure of the introduced water vapor was $8.6\times10^{-2}$ Pa in Example 3.

In the above-mentioned thin film transistor, after an insulating layer (protective layer) 16 covers and is patterned, a short side of an island of an ITO film forming a drain electrode 12 is extended to be 100 μm, and the extended portion having the length of 90 μm is left to secure wiring to a source electrode 11 and to a gate electrode 15. A polyimide film is applied thereon and a rubbing process is carried out. Meanwhile, similarly, a plastic substrate having an ITO film and a polyimide film formed thereon and which then undergoes a rubbing process is prepared, and is opposed to the above-mentioned substrate having the thin film transistor formed thereon with a gap of 5 μm therebetween, and nematic liquid crystal is injected into the gap. Further, a pair of polarizing plates are provided such that one of the polarizing plates is on one side of the structure and the other of the polarizing plates is on the other side of the structure. Here, when voltage is applied to the source electrode of the thin film transistor and voltage applied to the gate electrode is changed, the light transmittance changes only in a region of 30 μm×90 μm which is a part of the island of the ITO film extended from the drain electrode. Further, the transmittance may be continuously changed also by source-drain voltage when gate voltage is applied such that the thin film transistor is turned on. In this way, a display apparatus corresponding to the one illustrated in FIG. 7 and having a liquid crystal cell as a display device is prepared. It is to be noted that FIG. 12 also illustrates a substrate 10, a channel layer 13, and a gate insulating film 14.

In this example, a white plastic substrate is used as the substrate on which the thin film transistor is formed. The electrodes of the thin film transistor are replaced by gold, and the polyimide film and the polarizing plates are eliminated. A capsule having particles and fluid encapsulated in an insulating film thereof is made to fill the gap between the white and transparent plastic substrates. In the case of this display apparatus having the above-mentioned structure, voltage between the drain electrode extended in the thin film transistor and the upper ITO film is controlled, thereby moving up and down the particles in the capsule. Therefore, by controlling the reflectivity in the extended drain electrode region seen from the side of the transparent substrate, display may be carried out.

Further, in this example, a plurality of thin film transistors may be formed so as to be adjacent to one another to form a current control circuit having, for example, a popular structure including four transistors and one capacitor with one transistor at the last stage thereof being the thin film transistor illustrated in FIG. 12 to drive EL devices. For example, a thin film transistor with the above-mentioned ITO film being used as a drain electrode thereof is used. An organic electroluminescent device including an electron injection layer and an emission layer is formed in the region of 30 μm×90 μm which is a part of the island of the ITO film extended from the drain electrode. In this way, the display apparatus using EL devices illustrated in FIG. 6 may be formed.

EXAMPLE 5

In this example, the display devices and the thin film transistors of Example 4 are disposed two-dimensionally. For example, pixels each occupying an area of about 30 μm×115 μm including the display device such as a liquid crystal cell or an EL device and the thin film transistor of Example 4 are disposed at a pitch of 40 μm in a direction of a short side and at a pitch of 120 μm in a direction of a long side are disposed so as to form a rectangle of 7,425×1,790 pixels. Further, 1,790 gate wirings which go through gate electrodes of 7,425 thin film transistors in the direction of the long side and 7,425 signal wirings which go, in the direction of the short side, through portions of the source electrodes of 1,790 thin film transistors extended by 5 μm from the island of the amorphous oxide semiconductor film are provided, and are connected to a gate driver circuit and a source driver circuit, respectively. In the case of a liquid crystal display device, by providing on a surface thereof a color filter of the same size as the liquid crystal display device and which is aligned with the liquid crystal display device and by repeatedly providing such color filters of RGB in cycles in the direction of the long side, an A4-sized active matrix color image display apparatus with about a 211 ppi resolution may be formed.

In the case of an EL device, a gate electrode of a first thin film transistor of two thin film transistors included in one EL device is connected to a gate line while a source electrode of a second thin film transistor is connected to a signal line. Further, the light emitting wavelength of the EL device is changed in cycles in RGB in the direction of the long side. In this way, a light emitting color image display apparatus with the same resolution may be formed.

Here, the driver circuits for driving the active matrix may be formed using the thin film transistors according to the present invention which are the same as the thin film transistors of the pixels, or may be formed using existing IC chips.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-219888, filed Aug. 28, 2008, which is hereby incorporated by reference herein in its entirety.

What is claimed is:

1. A method of manufacturing a thin film transistor comprising a substrate, a channel layer, a gate insulating layer, a source electrode, a drain electrode, and a gate electrode, the channel layer comprising an amorphous oxide semiconductor containing hydrogen and at least one element of indium (In) and zinc (Zn), the method comprising:

forming the channel layer by sputtering using a film forming gas containing water vapor; and carrying out thermal treatment at 150° C. or higher to 500° C. or lower after the channel layer is formed.

2. The method of manufacturing a thin film transistor according to claim 1, wherein a partial pressure of the introduced water vapor in the film forming gas is $8 \times 10^{-4}$ Pa or higher.

3. A method of manufacturing a thin film transistor comprising a substrate, a channel layer, a gate insulating layer, a source electrode, a drain electrode, and a gate electrode, the channel layer comprising an amorphous oxide semiconductor containing hydrogen and at least one element of indium (In) and zinc (Zn), the method comprising:

forming the channel layer by applying a solution; and carrying out thermal treatment at 500° C. or lower after the channel layer is formed.

4. A method of manufacturing a thin film transistor comprising a substrate, a channel layer, a gate insulating layer, a source electrode, a drain electrode, and a gate electrode, the channel layer comprising an amorphous oxide semiconductor containing hydrogen and at least one element of indium (In) and zinc (Zn), the method comprising:

forming the channel layer by electrodeposition; and carrying out thermal treatment at 500° C. or lower after the channel layer is formed.

\* \* \* \* \*